(12) United States Patent
Wichman

(10) Patent No.: US 6,531,903 B1
(45) Date of Patent: Mar. 11, 2003

(54) DIVIDER CIRCUIT, METHOD OF OPERATION THEREOF AND A PHASE-LOCKED LOOP CIRCUIT INCORPORATING THE SAME

(75) Inventor: Shannon A. Wichman, McKinney, TX (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/929,183

(22) Filed: Aug. 14, 2001

(51) Int. Cl.[7] .............................................. H03B 19/00
(52) U.S. Cl. ...................... 327/117; 327/115; 327/157
(58) Field of Search ................................ 327/115, 117, 327/148, 157, 160; 377/47, 48

(56) References Cited

U.S. PATENT DOCUMENTS

| | | | | |
|---|---|---|---|---|
| 5,339,345 A | * | 8/1994 | Mote, Jr. ..................... 377/114 |
| 5,384,816 A | * | 1/1995 | Prysby et al. ................. 377/48 |
| 5,614,869 A | * | 3/1997 | Bland .......................... 331/1 A |
| 5,729,179 A | * | 3/1998 | Sumi ........................... 327/115 |
| 6,121,801 A | * | 9/2000 | Lee ............................. 327/115 |
| 6,393,088 B1 | * | 5/2002 | Emineth et al. .............. 377/20 |

* cited by examiner

Primary Examiner—Kenneth B. Wells
Assistant Examiner—Cassandra Cox
(74) Attorney, Agent, or Firm—Witt Gaines & Boisbrun, P.C.

(57) ABSTRACT

The present invention provides a divider circuit for frequency division of input clock signals, and a method operating and a phase-locked loop (PLL) circuit incorporating the same. In one embodiment, the divider circuit includes a counting subcircuit configured to count rising and falling edges of an input signal. In addition, the divider circuit includes, a signal generator configured to provide an output signal by performing an operation on the count of the rising and falling edges of the input signal based on a divisor control signal.

15 Claims, 4 Drawing Sheets

DIVIDER CIRCUIT, METHOD OF OPERATION THEREOF AND A PHASE-LOCKED LOOP CIRCUIT INCORPORATING THE SAME

TECHNICAL FIELD OF THE INVENTION

The present invention is directed, in general, to signal processing circuits and, more specifically, to a divider circuit, method of operation thereof and a phase-locked loop (PLL) circuit incorporating the same.

BACKGROUND OF THE INVENTION

In modern digital electronic computers, cooperating sequential logic circuits performing routine operations, are each controlled by derivatives of a master, or reference, clock signal. These derivative clock signals are typically synchronized within the system to assist in optimizing computer functions, although they often do not arrive at their intended destinations in proper synchronism. Reasons for such skew in the derivative signals include, for example, variations in signal propagation delay for each destination. As a result, combining several complex sequential logic circuits within a system presents a challenge with respect to synchronizing the clock signals transmitted to the respective circuits therein.

As application specific integrated circuits (ASICs) such as high density programmable logic devices (PLDs) become available, on-chip clock distribution becomes more important to the integrity and performance of the designs implemented in these devices. Unfortunately, with the advent of ASCIs such as high-density PLDs, difficulties in managing clock delay and clock skew on these devices has become substantial. Many existing solutions for such problems, such as hardwired clock trees, are less effective for the applications found in today's programmable logic market. As integration levels of microelectronic circuits and system complexity continue to increase, the routing or distribution of a master system clock has become even more critical. This challenge is especially exacerbated in view of ever increasing clock rates in today's powerful microprocessors.

A common solution is the incorporation of a circuit having a phase-locked loop (PLL) architecture to assist in synchronizing clock signals in such devices. Because of the advantages, employing a voltage controlled oscillator (VCO) in a clock management circuit to create a PLL architecture has continued to gain popularity among device designers. Such ring oscillators generate an output clock signal from a comparison between the reference clock signal and a feedback signal derived from the output signal. By doing so, the PLL architecture provides feedback that is used to nullify clock distribution problems within the circuit. The difference between the two signals is used in a feedback control system to bring the signals into a substantially fixed phase relation.

Commonly, such PLL circuits are employed to also alter the frequency of the output signal, so-called "frequency synthesis." To provide frequency synthesis, one or both of the incoming signals are divided before being input to the VCO. Those skilled in the art understand that arriving at an output signal of a signal divider based on a factor of two is relatively simple. In such a case, a single divider may be used to divide the incoming feedback signal before being compared with the reference clock signal. For example, if the output signal of a divider circuit with a frequency of 10 MHz is desired from a feedback signal of 20 MHz, a single divider with a value of n=2 may be used to arrive at the desired output signal.

The difficulty in signal division increases when the output signal desired from the divider circuit cannot be derived as a factor of two (an even factor). For example, if an output signal with a frequency of 10 MHz is desired from a 150 MHz feedback signal, a divide factor of 15 must be created. Since 15 is not an even factor, a second divider circuit is typically used to divide the reference clock signal, while the first divider circuit is still used to divide the feedback signal. The two divided signals may then be combined to arrive at the desired odd-numbered frequency. In this example, the first divider circuit may use a divide factor of n=30, while the second divider circuit may use a divide factor of m=2 (both even factors), to arrive at an overall divide factor of n/m=30/2=15 (an odd factor).

Although quite common, the use of two dividers in prior art PLL circuits has disadvantages. More specifically, employing two dividers, for instance in an odd-factor signal divide, involves the use of extra logic devices, an inefficient use of circuit time and power. In addition, employing a second divider to modify the reference clock signal from its original state may result in excessive jitter in the circuit. Moreover, for programmable systems where the frequency of the output signal is selectable "on-the-fly", control logic configured to control both dividers needs to be included in the PLL circuit. Those skilled in the art understand the high cost often associated with such controllers, as well as the complex logic circuits required for two divide operations.

Accordingly, what is needed in the art is a divider circuit employable in a PLL environment that overcomes the deficiencies found in the prior art.

SUMMARY OF THE INVENTION

To address the above-discussed deficiencies of the prior art, the present invention provides a divider circuit that performs operations on an input signal, such as a clock signal. In one embodiment, the divider circuit includes a counting subcircuit configured to count rising and falling edges of the input signal. In addition, the divider circuit includes a signal generator configured to provide an output signal by performing an operation on the count of the rising and falling edges of the input signal based on a divisor control signal.

The present invention also provides a method of operating a divider circuit. In one embodiment, the method includes counting rising and falling edges of an input signal, and providing an output signal by performing an operation on the count of the rising and falling edges of the input signal based on a divisor control signal.

In addition, the present invention provides a phase-locked loop (PLL) circuit. In one embodiment, the PLL circuit includes a comparator circuit configured to compare a phase of a feedback signal to a phase of an input signal of the PLL circuit and generate charge and discharge signals. The PLL circuit further includes a charge pump configured to generate a charge current as a function of the charge and discharge signals, as well as a filter configured to generate a control signal as a function of the charge and discharge signals. Also, the PLL circuit includes an oscillator configured to generate an output clock signal as a function of the control signal. The PLL circuit still further includes a divider circuit having a counting subcircuit configured to count rising and falling edges of the output clock signal, and a signal generator configured to provide the feedback signal by performing an operation on the count of the rising and falling edges of the output clock signal based on a divisor control signal.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
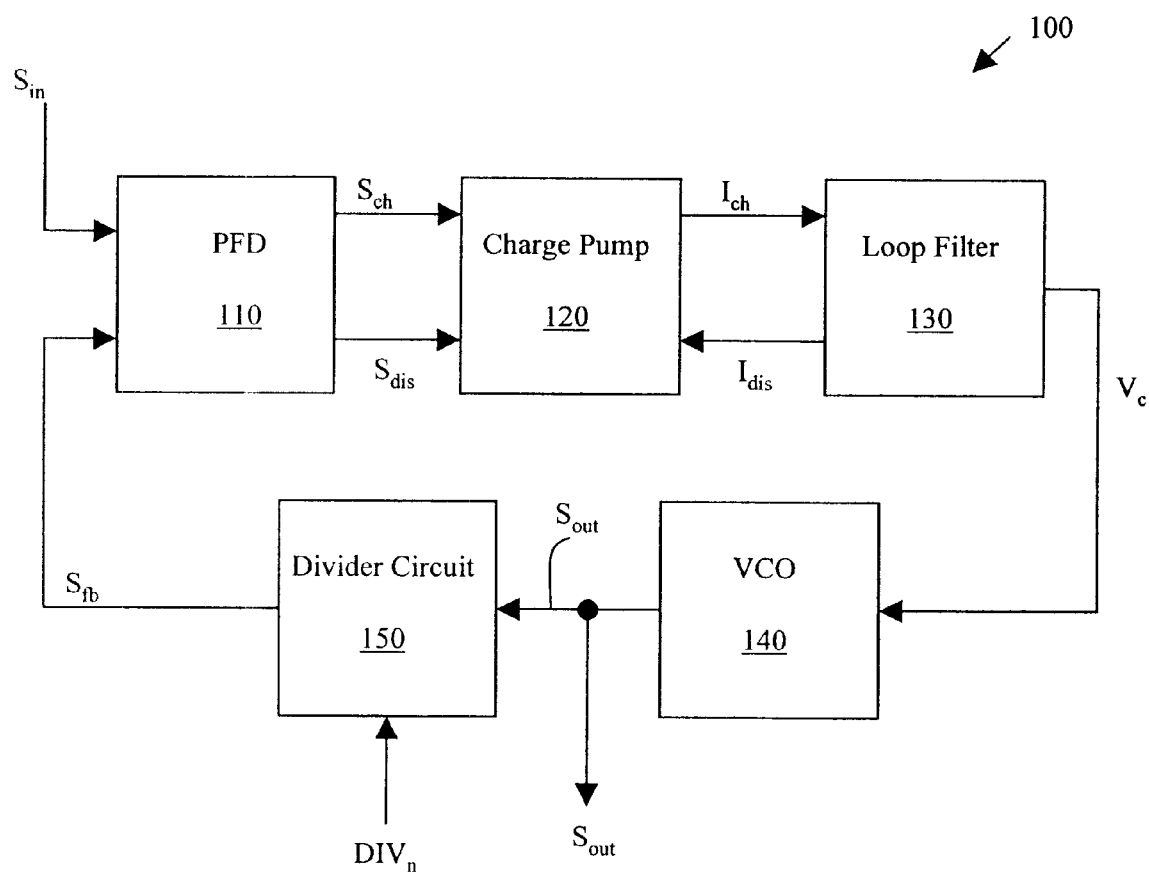
FIG. 1 illustrates a block diagram of an embodiment of a phase-locked loop circuit that may provide an environment for a divider circuit constructed according to the principles of the present invention.

Referring initially to FIG. 1, illustrated is a block diagram of an embodiment of a phase-locked loop (PLL) circuit 100 that may provide an environment for a divider circuit 150 constructed according to the principles of the present invention. The PLL circuit 100 accepts a master input signal $S_{in}$ and an output feedback signal $S_{fb}$, and includes a phase and frequency detector (PFD) 110 used for comparing both the signals $S_{in}$, $S_{fb}$ input to the PLL circuit 100. Of course, other types of comparator circuits, having different components, may be used to determine differences in input signals, and the present invention is not limited to any particular one.

The PFD 110 has two output signals, a charge signal $S_{ch}$ and a discharge signal $S_{dis}$, which are input to a charge pump 120. The charge pump 120 generates a charge current $I_{ch}$ during charging or causes a discharge current $I_{dis}$ to flow back to itself during discharging. The PLL circuit 100 also includes a loop filter 130 coupled to the charge pump 120. In response to the charge current $I_{ch}$ or the discharge current $I_{dis}$, the loop filter 130 filters the current signals $I_{ch}$, $I_{dis}$ from the charge pump 120 and generates a voltage control signal $V_c$ as a function of a charge/discharge rate. The loop filter 130 then sends the voltage control signal VC to a voltage controlled oscillator (VCO) 140.

The VCO 140 converts the voltage control signal $V_c$ to a desired output clock signal $S_{out}$ and transmits the signal to other circuits or components associated with the PLL circuit 100. In addition, the output clock signal $S_{out}$ is also fed into the divider circuit 150. The output of the divider circuit 150, which may be a divider circuit constructed according to the principles of the present invention, provides the feedback signal $S_{fb}$. In an advantageous embodiment, the divider circuit 150 is programmed with a divisor control signal $DIV_n$ to alter (e.g., divide) the output signal $S_{out}$ when providing the feedback signal $S_{fb}$. For example, the divider circuit 150 may divide the frequency of the output clock signal $S_{out}$ such that the feedback signal $S_{fb}$ substantially equals the frequency of the master input signal $S_{in}$. In this example, the substantially equal signals input to the PFD 110 may lock the output clock signal $S_{out}$ at a particular frequency. Those skilled in the art understand the details and advantages of performing such frequency synthesis within a clock management circuit having a PLL architecture, so that discussion will not herein be presented.

Figure 2:
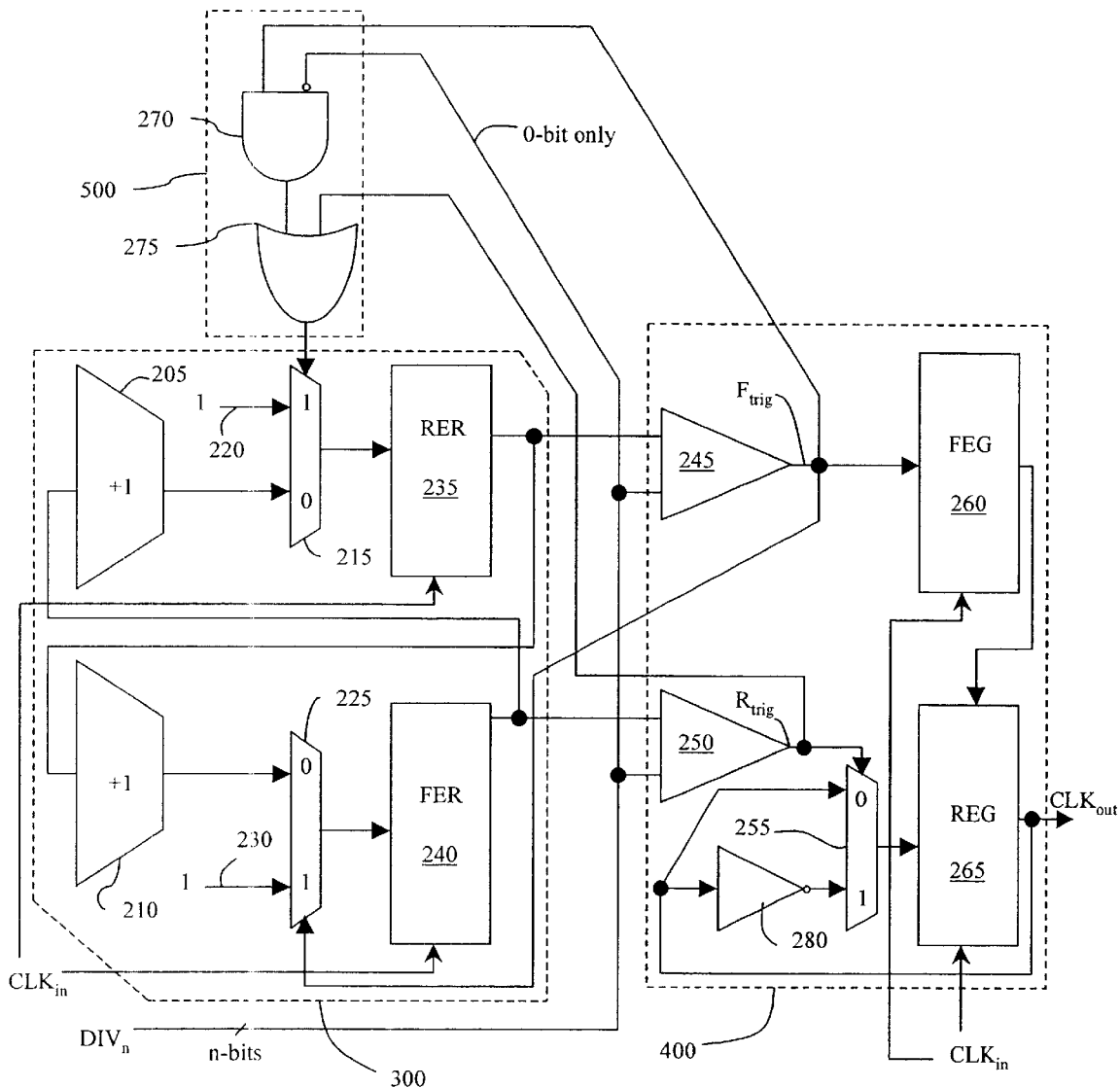
FIG. 2 illustrates one embodiment of a divider circuit constructed in accordance with the principles of the present invention.

Turning now to FIG. 2, illustrated is one embodiment of a divider circuit 200 constructed in accordance with the present invention. In the illustrated embodiment, the divider circuit 200 is a logic divider used for division of a frequency of an input signal $CLK_{in}$ in performing frequency synthesis of an output signal $CLK_{out}$. In an exemplary embodiment, the input signal $CLK_{in}$ of the divider circuit 200 represents the output clock signal $S_{out}$ of the PLL circuit 100, while the output signal $CLK_{out}$ represents the feedback signal $S_{fb}$. Advantageously, the divider circuit 200 of the present invention may be employed to perform both even and odd divides of the input signal $CLK_{in}$, rather than using two divider circuits to divide, for instance, both the feedback signal $S_{fb}$ and the master input signal $S_{in}$.

The divider circuit 200 includes a counting subcircuit 300. In the illustrated embodiment, the counting subcircuit 300 includes rising and falling edge incrementers (e.g., first and second n-bit incrementers 205, 210). An output of the first n-bit incrementer 205 is fed into a first n-bit multiplexer 215, along with a first binary n-bit value (=1) 220. In addition, an output of the second n-bit incrementer 210 is fed into a second n-bit multiplexer 225, along with a second binary n-bit value (=1) 230.

Outputs from the multiplexers 215, 225 are input to a rising edge register (RER) 235 and a falling edge register (FER) 240, respectively. The RER 235 and FER 240 capture the n-bit value for the rising and falling edges of the input signal $CLK_{in}$, respectively. The counter subcircuit 300 provides two output signals, via the RER 235 and the FER 240, which are fed into a signal generator 400.

The signal generator 400 includes a plurality of comparators (e.g., first and second n-bit logical comparators 245, 250), an inverter 280, and a 1-bit multiplexer 255. The n-bit comparators 245, 250 are configured to generate a single n-bit value that is logically high when either's two input n-bit values are equal. An output of the first n-bit logical comparator 245 is fed into a falling edge output subcircuit [e.g., a falling edge generator (FEG) 260]. An output of the second n-bit logical comparator 250 is used as a control signal for the 1-bit multiplexer 255. Then, similar to the first n-bit logical comparator 245, an output signal of the 1-bit multiplexer 255 is fed into a rising edge output subcircuit [e.g., a rising edge generator (REG) 265]. The REG 265 produces the output clock signal $CLK_{out}$, which is fed back to the 1-bit multiplexer 255 as a true value and as an inverted value via the inverter 280. In addition, the output clock signal $CLK_{out}$ may serve as the feedback signal $S_{fb}$ shown in FIG. 1. The output of the first n-bit logical comparator 245 is also fed back to the second n-bit multiplexer 225, as well as to a reset subcircuit 500. The output of the second n-bit logical comparator 250 is also fed into the reset subcircuit 500. As discussed in detail below, the reset subcircuit 500 ensures that the counting subcircuit 300 begins counting the edges of the input signal $CLK_{in}$ at a proper time.

A divisor control signal $DIV_n$ comprised of an n-bit value having a bit-width of n, is also illustrated in association with the divider circuit 200. The divisor control signal $DIV_n$ is input as a reference value to both the first and second n-bit logical comparators 245, 250. In addition, the zero-bit of the divisor control signal $DIV_n$ is also input to the reset subcircuit 500, and inverted at an input of an AND gate 270. For example, for even-factor divides, the zero-bit of the divisor control signal $DIV_n$ is always low. In accordance with the present invention, the divisor control signal $DIV_n$ represents the input of a dividing factor n employed to divide the frequency of the input signal $CLK_{in}$, where "n" is the logical value of the divide factor desired. For example, for an even-factor divide, the divisor control signal $DIV_n$ may be used to input a divide factor n of 6. However, in an advantageous embodiment, the divisor control signal $DIV_n$ may be used to enter an odd-factor divide, such as n=3, which would result in an odd-factor division of the input signal $CLK_{in}$ using the same divider circuit 200.

Figure 3:
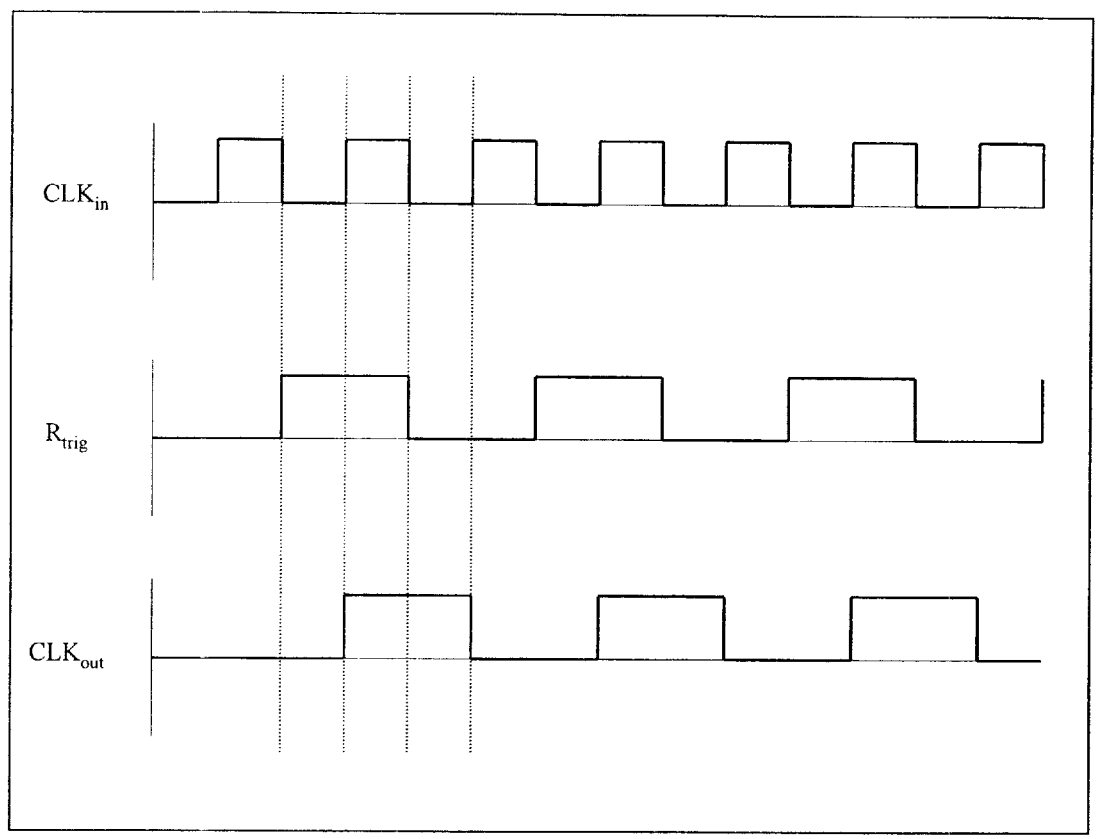
FIG. 3 illustrates a set of timing diagrams representing an even-factor divide of an input signal performed with the divider circuit of FIG. 2.

Looking at FIG. 3, while referencing the divider circuit 200 of FIG. 2, an even-factor divide performed by the present invention may be explored in greater detail. As illustrated, the counting subcircuit 300 is configured to count both the rising and falling edges of the input signal $CLK_{in}$. More specifically, assuming the counting subcircuit 300 begins to count at the proper time, the RER 235 begins the counting process by counting a "1" (by registering the n-bit value) for the first rising edge of the input signal $CLK_{in}$ detected. For the example mentioned above where the divide factor n is 6, the 1 is then input to the second n-bit incrementer 210, incremented by +1, and the result input to the second n-bit multiplexer 225 and the FER 240. Now having a 1 in its registers, the FER 240 would then count the first falling edge of the input signal $CLK_{in}$ as a "2". This 2 would then be fed into the first n-bit incrementer 205, incremented by +1, and fed through the first n-bit multiplexer 215 and back into the RER 235. Having a 3 now in its registers, the second rising edge of the input signal $CLK_{in}$ would be counted by the RER 235 as a "4".

While the RER 235 and FER 240 are used to count rising and falling edges at increments of one, each count is also input to the signal generator 400. More accurately, each count of the RER 235 is fed into the first n-bit logical comparator 245, as well as the second n-bit incrementer 210. Likewise, each count of the FER 240 is fed into the second n-bit logical comparator 250, in addition to the first n-bit incrementer 205. Both the first and second n-bit logical comparators 245, 250 compare the divide factor n input through the divisor control signal $DIV_n$ with the respective outputs of the RER 235 and FER 240. In the example of n=6 above, both of the n-bit logical comparators 245, 250 would maintain a low output signal until the count reaches 6. While the n-bit logical comparators 245, 250 maintain a low output signal, the RER 235 and FER 240 continue counting the rising and falling edges of the input signal $CLK_{in}$, respectively.

When the FER 240 finally counts "6", the second n-bit logical comparator 250 produces a logical high output that is used as a rising edge trigger signal $R_{trig}$. As mentioned above, the rising edge trigger signal $R_{trig}$ is used as a control signal for the 1-bit multiplexer 255 to control the input to the REG 265 in order to generate the first rising edge of the output signal $CLK_{out}$. In contrast, since the RER 235 never counts a 6, the first n-bit logical comparator 245 does not find a true comparison with the n-bit value in the divisor control signal $DIV_n$. As a result, the first n-bit logical comparator 245 will not generate a falling edge trigger signal $F_{trig}$ when the divide factor n is an even factor so long as the RER 235 begins the counting. In addition, the rising edge trigger signal $R_{trig}$ is fed back to the reset subcircuit 500 thereby resetting the counting subcircuit 300 to "0" so that counting of the rising and falling edges of the input signal $CLK_{in}$ starts over. Thus, the RER 235 will begin by counting a 1 on the next rising edge, while the FER 240 counts a 2 on the next falling edge.

Since the FER 240 is now counting a 2 rather than the 6 it counted before, the second n-bit logical comparator 250 is driven to a logically low value again, stopping the rising edge trigger signal $R_{trig}$. However, the REG 265 continues to produce a high signal for the output signal $CLK_{out}$ until another 6 is counted by the FER 240. At that time, the rising edge trigger signal $R_{trig}$ will become a logically high value again, and the REG 265 will "flip-flop" or invert to drive the output signal $CLK_{out}$ low. Thus, in this example (n=6), one-half cycle of the output signal $CLK_{out}$ is produced for every three cycles of the input signal $CLK_{in}$. The REG 265 keeps the output signal $CLK_{out}$ low until yet another $6^{th}$ edge is counted by the FER 240. At that time, the rising edge trigger signal $R_{trig}$ will become a logically high value again, the REG 265 will again flip-flop the operation, and one full cycle of the output signal $CLK_{out}$ is completed. As a result, one full cycle of the output signal $CLK_{out}$ is generated by the divider circuit 200 for every six cycles of the input signal $CLK_{in}$.

In one embodiment, using the process of the present invention described herein, the divider circuit 200 enjoys substantial utility by providing a 50% duty cycle for the output signal $CLK_{out}$ while performing an even-factor divide. Specifically, using the example above, since the first one-half cycle of the output signal $CLK_{out}$ is generated during the first three cycles of the input signal $CLK_{in}$ and the second one-half cycle is generated during the second three cycles of the input signal $CLK_{in}$, one half of the output signal $CLK_{out}$ substantially equals the other half. Therefore, since each half of the output signal $CLK_{out}$ is substantially equal to the other half, an output signal $CLK_{out}$, with about a 50% duty cycle may be generated. Of course, those skilled in the art understand that the divider circuit 200 of the present invention may be modified to generate an output signal $CLK_{out}$ having a different duty cycle.

Figure 4:
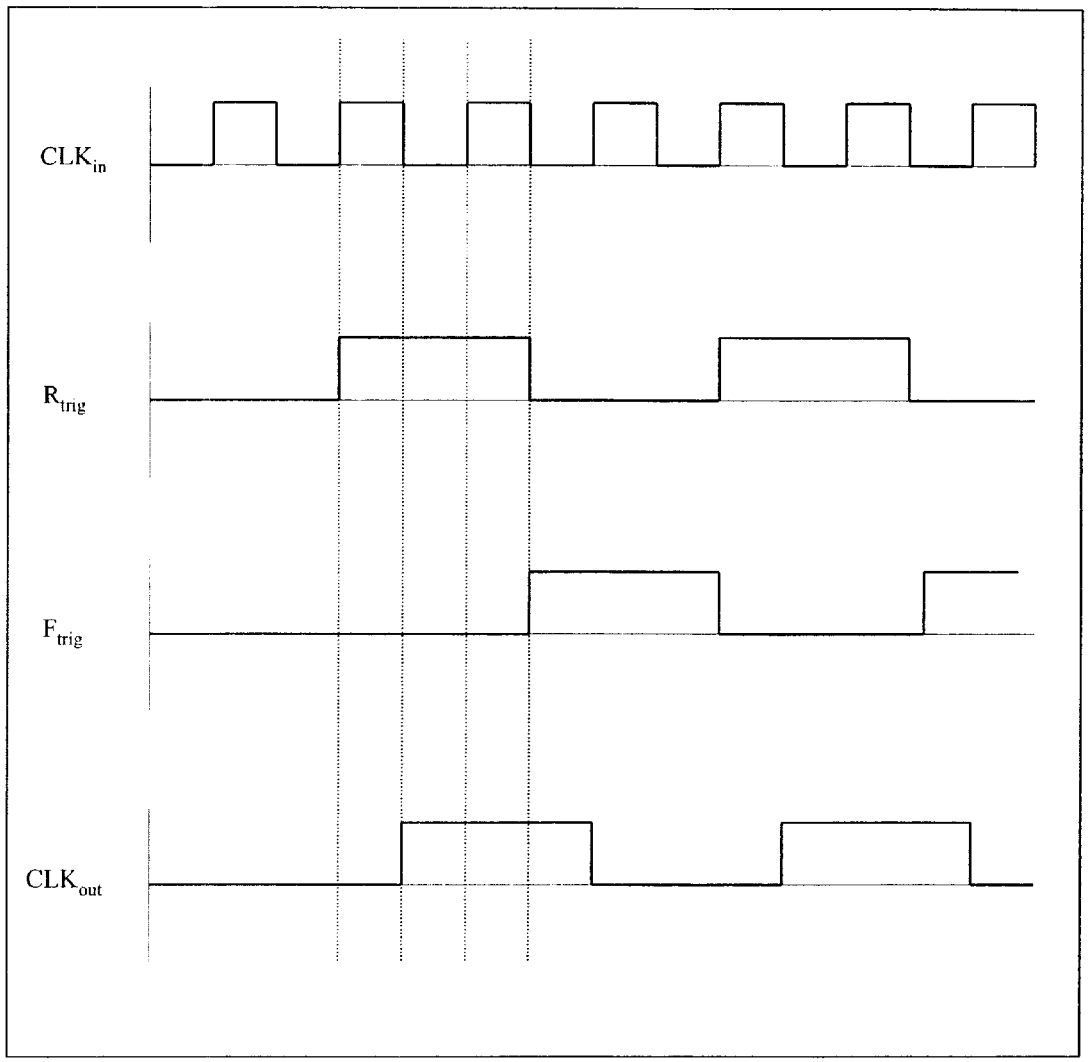
FIG. 4 illustrates a set of timing diagrams representing an odd-factor divide of an input signal performed with the divider circuit of FIG. 2.

Looking now at FIG. 4, together with the divider circuit 200 of FIG. 2, an odd-factor divide performed by the divider circuit 200 may be described in detail. For odd-factor divides, such as a divide factor n of 3, the FEG 260 is employed to alternate the beginning of the counting between the RER 235 and FER 240. Specifically, for even-factor divides (such as the n=6 above) only the RER 235 counts the odd numbers, while for odd-factor divides the odd numbers are first counted by the RER 235 and then by the FER 240. The result of this count alternation is that for a selected odd divide factor n (for example n=3), the divide factor n will be reached by both the RER 235 and FER 240 in turn. An example where the divisor control signal $DIV_n$, is set with an odd divide factor n of 3 will provide a more comprehensive explanation.

Assuming again that the RER 235 begins the counting by counting a 1 on the first rising edge of the input signal $CLK_{in}$, the FER 240 then counts a 2 on the first falling edge. Next, the RER 235 counts a 3 so the first n-bit logical comparator 245 produces the falling edge trigger signal $F_{trig}$. The falling edge trigger signal $F_{trig}$ is fed into the FEG 260, which is in turn input to the REG 265 to flip-flop its operation. Assuming the output signal $CLK_{out}$ starts at high, the REG 265 will now drive it low.

In addition, the falling edge trigger signal $F_{trig}$ is also used as a feedback signal to the second n-bit multiplexer 225. With this feedback signal to the second n-bit multiplexer 225, the counting is not only started over, but also is begun by the FER 240 counting a 1 on the first rising edge. Since the FER 240 is now counting the odd numbers, the FER 240 will count the 3, and the second n-bit logical comparator 250 will now be driven high and produce the rising edge trigger signal $R_{trig}$. The rising edge trigger signal $R_{trig}$ then causes the REG 265 to generate a rising edge on the output signal $CLK_{out}$, driving it high again. When the RER 235 and FER 240 again switch the numbers they are counting, the RER 235 will be the one to count the 3, driving the first n-bit logical comparator 245 high again and producing the falling edge trigger signal $F_{trig}$. The falling edge trigger signal $F_{trig}$, on the next falling edge of the input signal $CLK_{in}$, causes the FEG 260 to reset the REG 265, which forces the output signal $CLK_{out}$ low again. By repeating this process, a full cycle for the output signal $CLK_{out}$ may be generated for every 3 cycles of the input signal $CLK_{in}$.

As with the even-factor divide discussed above, the divider circuit 200 again enjoys substantial utility by providing a 50% duty cycle for the output signal $CLK_{out}$. Since the first one-half cycle of the output signal $CLK_{out}$ is generated during the first one and one-half cycle of the input signal $CLK_{in}$ and the second one-half cycle is generated during the second one and one-half cycle of the input signal $CLK_{in}$, one half of the output signal $CLK_{out}$ again substantially equals the other half. Thus, since each half of the output signal $CLK_{out}$ is substantially equal, an output signal $CLK_{out}$ with about a 50% duty cycle is generated. Of course, also as before, performing an odd-factor division according to the principles of the present invention is not limited to producing an output signal having a 50% duty cycle.

As shown in FIG. 2, the divider circuit 200 still further includes the reset subcircuit 500 mentioned above. In accordance with the present invention, the reset subcircuit 500 may be synchronizing and/or self-correcting. In the illustrated embodiment, the reset subcircuit 500 is constructed with an AND gate 270 and an OR gate 275. Based on the inputs to these gates 270, 275, the reset subcircuit 500 may be configured to automatically reset the counting subcircuit 300 of the divider circuit 200 such that counting of the input signal $CLK_{in}$ repeatedly begins at the same point. Specifically, the odd and even examples of signal dividing discussed above assumed that counting of the input signal $CLK_{in}$ began with the RER 235 counting a "1" on the first rising edge of the input signal $CLK_{in}$ when counting first started. However, those skilled in the art understand that a divider circuit may begin counting incorrectly when first powered on. Circuits found in the prior art typically required a manual reset, or at least a few clock cycles of the input signal $CLK_{in}$ before a reset of the circuit could be completed. Although not necessary with the present invention, the reset subcircuit 500 may be employed to reset the divider circuit 200 automatically within one clock cycle of the input signal $CLK_{in}$ should counting begin at the improper point.

Although the divider circuit 200 of the present invention has been described, those skilled in the art understand that the divider circuit 200 may be constructed using different components than those illustrated in FIG. 2. Moreover, such a divider circuit 200 may also include greater or fewer components than discussed above. Additionally, the divider circuit 200 may perform other operations employing a different factor for the divisor control signal $DIV_n$.

By providing a divider circuit capable of performing both even and odd divides of an input clock signal, the present invention provides several benefits over the prior art. For instance, since only one divider circuit is necessary with the present invention, division of the reference signal of a circuit such as a PLL circuit, which may result in excessive jitter in the circuit, need not be done. In addition, the present invention provides the need for only one divider circuit to perform odd-factor divides within a PLL circuit. Those skilled in the art understand that by employing only one divider circuit, the reduction in the number of components allows for a more efficient operation of the PLL circuit. Such component reduction also simplifies the control logic typically found in conventional circuits to control the divider circuits. Moreover, a reduction in the number of components further means an increase in power efficiency, as well as a reduction in manufacturing costs, of a PLL circuit incorporating a divider circuit according to the present invention.

Although the present invention has been described in detail, those skilled in the art should understand that they can make various changes, substitutions and alterations herein without departing from the spirit and scope of the invention in its broadest form.

What is claimed is:

1. A divider circuit, comprising:
    a counting subcircuit, having a rising edge incrementer and register and a falling edge incrementer and register, configured to count rising and falling edges of an input signal; and
    a signal generator having a rising edge output subcircuit and a falling edge output subcircuit configured to provide an output signal by performing an operation on said count of said rising and falling edges of said input signal based on a divisor control signal.

2. The divider circuit as recited in claim 1 wherein said signal generator comprises a plurality of comparators.

3. The divider circuit as recited in claim 1 wherein said rising edge output subcircuit includes a flip-flop.

4. The divider circuit as recited in claim 1 further comprising a reset subcircuit configured to begin a counting process of said counting subcircuit with one of said rising and falling edges.

5. The divider circuit as recited in claim 1 wherein said output signal has about a 50 percent duty cycle.

6. A method of operating a divider circuit, comprising:
    counting rising and falling edges of an input signal with a rising edge incrementer and register and a falling edge incrementer and register, respectively; and
    providing an output signal with a rising edge output subcircuit and a falling edge output subcircuit by performing an operation on said count of said rising and falling edges of said input signal based on a divisor control signal.

7. The method as recited in claim 6 wherein said providing is performed by a signal generator comprising a plurality of comparators.

8. The method as recited in claim 6 wherein said rising edge output subcircuit includes a flip-flop.

9. The method as recited in claim 6 further comprising resetting said divider circuit to begin a counting process of said counting subcircuit with one of said rising and falling edges.

10. The method as recited in claim 6 wherein said output signal has about a 50 percent duty cycle.

11. A phase-locked loop (PLL) circuit, comprising:
    a comparator circuit configured to compare a phase of a feedback signal to a phase of an input signal of said PLL circuit and generate charge and discharge signals;

a charge pump configured to generate a charge current as a function of said charge and discharge signals;

a filter configured to generate a control signal as a function of said charge and discharge signals;

an oscillator configured to generate an output clock signal as a function of said control signal; and a divider circuit, including:

a counting subcircuit, having a rising edge incrementer and register and a falling edge incrementer and register, configured to count rising and falling edges of said output clock signal; and a signal generator having a rising edge output subcircuit and a falling edge output subcircuit configured to provide said feedback signal by performing an operation on said count of said rising and falling edges of said output clock signal based on a divisor control signal.

12. The PLL circuit as recited in claim 11 wherein said signal generator comprises a plurality of comparators.

13. The PLL circuit as recited in claim 11 wherein said rising edge output subcircuit includes a flip-flop.

14. The PLL circuit as recited in claim 11 wherein said divider circuit further comprises a reset subcircuit configured to begin a counting process of said counting subcircuit with one of said rising and falling edges.

15. The PLL circuit as recited in claim 11 wherein said feedback signal has about a 50 percent duty cycle.

* * * * *